United States Patent
Debbins et al.

(10) Patent No.: US 6,275,035 B1
(45) Date of Patent: Aug. 14, 2001

(54) METHOD FOR USING THREE POINTS TO DEFINE A 2D MR IMAGING SECTION

(75) Inventors: Josef P. Debbins, Waukesha, WI (US); Stephen J. Riederer, Rochester, MN (US); Christopher J. Hardy, Schenectady; Robert D. Darrow, Scotia, both of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/200,165

(22) Filed: Nov. 25, 1998

(51) Int. Cl.$^7$ .............................. G01V 3/00; A61B 5/055
(52) U.S. Cl. ......................... 324/307; 600/410; 324/309
(58) Field of Search .................................. 324/309, 307, 324/318, 312, 314; 600/410, 412, 413

(56) References Cited

U.S. PATENT DOCUMENTS

| | | | |
|---|---|---|---|
| 4,830,012 | 5/1989 | Riederer | 600/410 |
| 5,512,826 | 4/1996 | Hardy et al. | 324/309 |
| 5,512,827 | 4/1996 | Hardy et al. | 600/410 |
| 5,514,962 | 5/1996 | Cline et al. | 324/309 |
| 5,560,361 | 10/1996 | Glusick | 600/410 |
| 5,657,757 | 8/1997 | Hurd et al. | 600/413 |
| 5,689,577 | * 11/1997 | Arata | 382/128 |
| 5,711,300 | 1/1998 | Schneider et al. | 600/412 |

OTHER PUBLICATIONS

Article excerpt from Magnetic Resonance in Medicine entitled "Cardiac Magnetic Resonance Fluoroscopy"; 8 pages (588–595); Received Aug. 18, 1995; revised Jan. 29, 1996; accepted Apr. 17, 1996.

Article excerpt from Magnetic Resonance in Medicine entitled "Interactive Selection of Optimal Section Orientations Using Real–Time MRI"; 6 pages (114–119); Received Dec. 6, 1994; revised Mar. 16, 1995; accepted Mar. 21, 1996.

Handout entitled "Interactive Three–Point Localization of Double–Oblique Sections Using MR Fluoroscopy"; 13 pages; submitted to Magnetic Resonance in Medicine Jul. 17, 1998.

(List continued on next page.)

*Primary Examiner*—Christine Oda
*Assistant Examiner*—Tiffany A. Fetzner
(74) *Attorney, Agent, or Firm*—Foley & Lardner; Christian G. Cabou

(57) ABSTRACT

A method and apparatus for producing an imaging plane on an image of a structure of interest, such as an anatomical structure, positioned in an MRI system. An operator interactively pages through real-time, planar sections of the structure of interest. Using an input device, the operator selects three separate points in a planar section of the structure under study. Within approximately one second of selection of the third point, the method of the present invention determines the imaging plane containing the three selected points, determines the centroid of the imaging plane centered on a triangle defined by the three selected points, sends such imaging geometry and in-plane offsets of the imaging plane directly to the MRI system to generate a new imaging plane optimally positioned with respect to the selected points on the structure of interest and displaying such new imaging plane. The operator can also selectively maneuver the imaging plane on the image of the structure of interest. The operator uses a graphical user interface in conjunction with the input device and a display screen for producing the imaging plane on the structure of interest. Such graphical user interface is referred to as a three point tool.

19 Claims, 3 Drawing Sheets

OTHER PUBLICATIONS

Hardy CJ et al: "Interactive coronary MRI" Magnetic Resonance in Medicine, Jul. 1998, Williams & Wilkins, USA vol. 40, No. 1, pp. 105–111, XP002132542 ISSN: 0740–3194.

Wilman A H et al: "Arterial phase carotid and vertebral artery imaging in 3D contrast–enhanced MR angiography by combining fluoroscopic triggering with an elliptical centric acquisition order" Magnetic Resonance in Medicine, Jul. 1998, Williams & Wilkins, USA, vol. 40, No. 1, pp. 24–35, XP002132543 ISSN: 0740–3194.

C.J. Hardy et al.: "Interactive Slice Prescription Schemes for Rapid MR Imaging of the Coronary Arteries" Proceedings of the Society of Magnetic Resonance, Secondmeeting, Aug. 6–12, 1994, San Francisco, USA, vol. 1, p. 500 XP002132544.

C.H. Lorenz et al.: "Interactive Cardiac Scan Planning on a Standard Clinical MR Scanner" Proceedings of the International Society for Magnetic Resonance in Medicine, Sixth Scientific Meeting and Exhibition, Sydney Australia, Apr. 18–24, 1998, vol. 3, p. 1958 XP002132545.

Kerr A B et al: "Real–Time Interactive MRI on a Conventional Scanner" Magnetic Resonance in Medicine, US, Academic Press, Duluth, MN, vol. 38, No. 3, Sep. 1, 1997, pp. 355–367, XP000699718 ISSN: 0740–3194.

V. Rasche et al.: "Interactie MR Fluoroscopy on a Clinical Scanner" Proceedings of the Internation Society for Magnetic Resonance in Medicine, Sixth Scientific Meeting and Exhibition, Sydney, Australia, Apr. 18–24, 1998, vol. 3, p. 1979 XP00213546.

* cited by examiner

METHOD FOR USING THREE POINTS TO DEFINE A 2D MR IMAGING SECTION

FIELD OF THE INVENTION

The field of the invention is nuclear magnetic resonance imaging methods and systems. More particularly, the invention relates to MRI imaging systems equipped for real-time imaging and methods for assisting the operator to interactively position the excitation profile for subsequent acquisition of the desired anatomical imaging section.

BACKGROUND OF THE INVENTION

When a substance such as human tissue is subjected to a uniform magnetic field (polarizing field Bo), the individual magnetic moments of the spins in the tissue attempt to align with this polarizing field, but process about it in random order at their characteristic Larmor frequency. If the substance, or tissue, is subjected to a magnetic field (excitation field $B_1$) which is the x-y plane and which is near the Larmor frequency, the net aligned moment, Mz, may be rotated, or "tipped", into the x-y plane to produce a net transverse magnetic moment M. A signal is emitted by the excited spins after the excitation signal $B_1$ is terminated and this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

When attempting to define the volume of coverage for an MRI scan, the NMR system operator may desire to prescribe a specific two dimension scan plane within the total volume of coverage. This process can be particularly useful when prescribing a double oblique, off axis two dimensional scan plane of complex anatomy such as vasculature.

Typically, two dimensional axial, sagittal and coronal "scout" images are first acquired. Such scout images are stored for later use. To use, the operator calls up the scout image and either graphically or explicitly (using geometry coordinates) prescribes the imaging volume directly on the scout images. The imaging volume may be either a two dimensional stack of slices or a three dimensional slab of the structure of interest. The drawback of this technique is that the operator does not actually see the results of the prescribed geometry until the subsequent imaging volume is acquired. Further, complex double oblique views are not easily visualized from standard scout images which makes the task of prescribing such sections difficult and time consuming.

SUMMARY OF THE INVENTION

In accordance with the present invention, Applicant provides a method and apparatus for producing an imaging plane on an image of a structure of interest, such as an anatomical structure, positioned in an MRI system. An operator interactively pages through real-time, planar sections of the structure of interest. Using an input device, the operator selects three separate points in up to three different planar sections of the structure under study. Within approximately one second of selection of the third point, the method of the present invention determines the imaging plane containing the three selected points, determines the centroid of the imaging plane centered on a triangle defined by the three selected points, sends such imaging geometry and in-plane offsets of the imaging plane directly to the MRI system to generate a new imaging plane optimally positioned with respect to the selected points on the structure of interest and displaying such new imaging plane. The operator can also selectively maneuver the imaging plane on the image of the structure of interest. The operator uses a graphical user interface in conjunction with the input device and a display screen for producing the imaging plane on the structure of interest. Such graphical user interface is referred to as a three point tool.

It is a principal object of the present invention to rapidly localize views on an image of a structure of interest displayed on a screen of a MRI system. Another object of the present invention is to calculate the unique plane that intersects three selected points on a structure of interest and direct real-time scan plan geometry to intersect such selected points and provide a unique, potentially double oblique view, centered on the centroid of the triangle defined by the three selected points.

Other principal features and advantages of the present invention will become apparent to those skilled in the art upon review of the following drawings, the detailed description and the appended claims.

Figure 1:
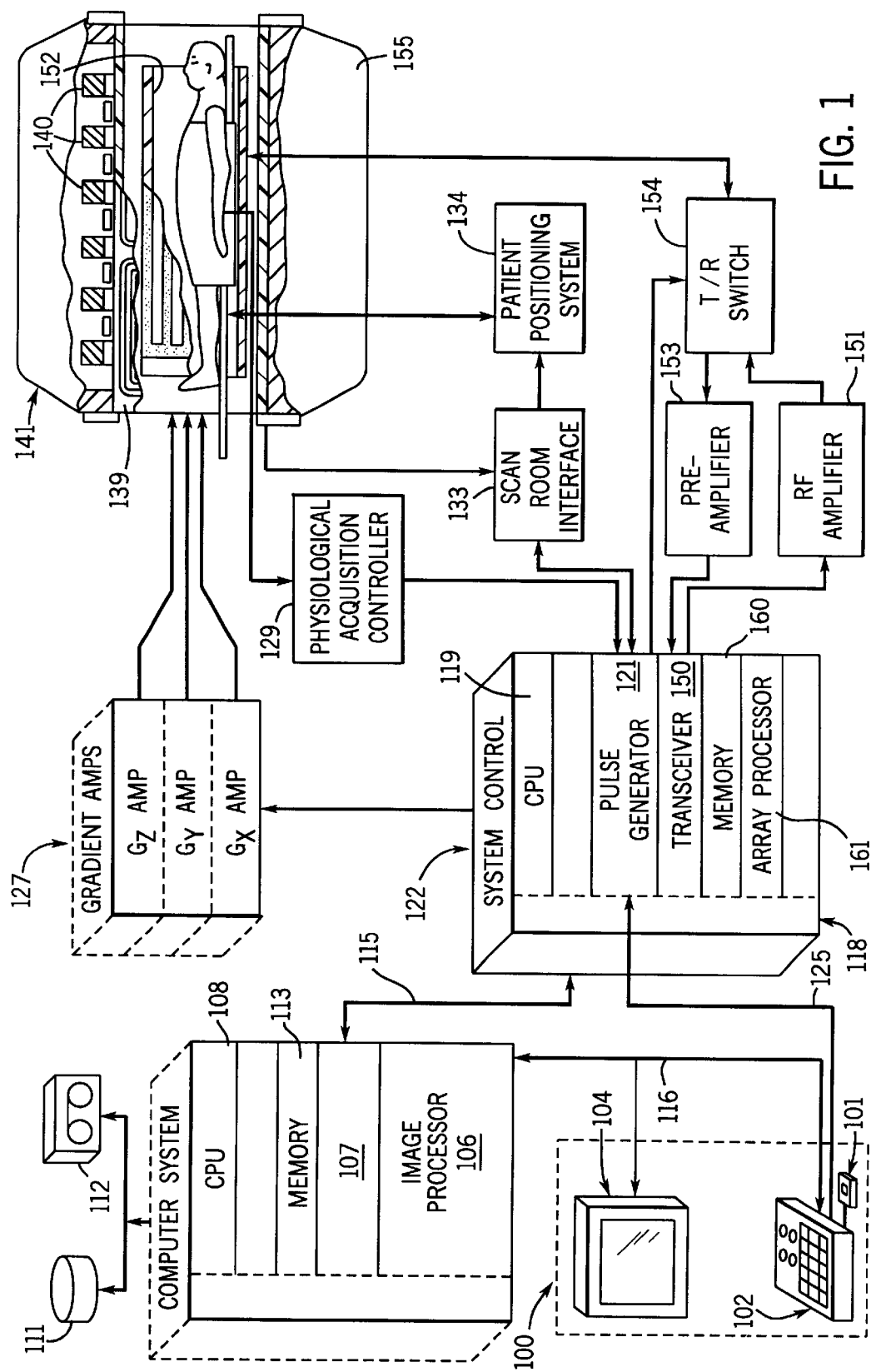
FIG. 1 is a block diagram of an MRI system which employs the present invention.

Before explaining the preferred embodiment of the invention in detail it is to be understood that the invention is not limited in its application to the details of construction and the arrangement of the components set forth in the following description as illustrated in the drawings. The invention is capable of other embodiments or being practiced or carried out in various ways. Also, it is to be understood that the phraseology and terminology employed herein is for the purpose of description and should not be regarded as limiting.

DETAILED DESCRIPTION OF THE PREFERRED EMBODIMENT

Referring first to FIG. 1, there is shown the major components of a preferred MRI system which incorporates the present invention. The operation of the system is controlled from an operator console 100 which includes an input device 101, a control panel 102 and a display-screen 104. The console 100 communicates through a link 116 with a separate computer system 107 that enables an operator to control the production and display of images on the screen 104. The computer system 107 includes a number of modules which communicate with each other through a backplane 118. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane 118. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$, and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152.

A transceiver module 150 in the system control 122 produces pulses which are amplified by an RF amplifier 151 and coupled to the RF coil 152 by a transmit/receiver switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
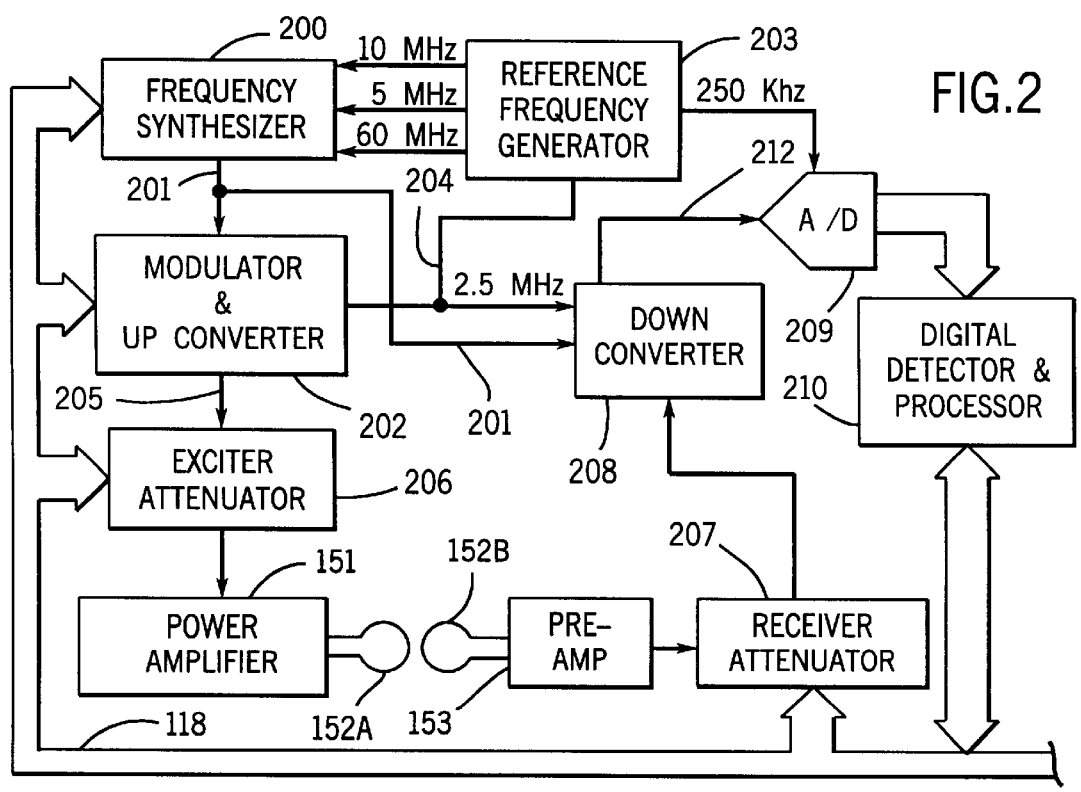
FIG. 2 is an electrical block diagram of the transceiver which forms part of the MRI system of FIG. 1.

Referring particularly to FIGS. 1 and 2, the transceiver 150 produces the RF excitation field $B_1$ through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 150, reference is made to U.S. Pat. No. 4,952,877 which is incorporated herein by reference.

Referring still to FIGS. 1 and 2 the NMR signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied on line 212. The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16 bit in-phase (I) values and 16-bit quadrature (Q) values corresponding to the received signal. The resulting stream of digitized I and Q values of the received signal are output through backplane 118 to the memory module 160 where they are normalized in accordance with the present invention and then employed to reconstruct an image to the input of an analog-to-digital (A/D) converter 209 which samples and digitizes the analog signal and applies it to a digital detector and signal processor 210 which produces 16 bit in-phase (I) values and 16-bit quadrature (Q) values corresponding to the received signal. The resulting stream of digitized I and Q values of the received signal are output through backplane 118 to the memory module 160 where they are normalized in accordance with the present invention and then employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

To practice the present invention, an operator maneuvers a two dimensional scan plane through the structure of interest, typically an anatomical structure such as the heart or head of a human being. Such maneuvering is accomplished from the operator console 100 using an input device 101. The input device 101 is selected from a group including a mouse, a joystick, a keyboard, a track ball, a voice control, a touch screen and a light wand. The NMR system of the present invention utilizes either a real-time MRI system or a non-real-time MRI system. In particular, real-time refers to continuous requisition and reconstruction of MR image data as rapidly as it is acquired by the MRI system. The real-time MRI system localizes planar sections and imaging volumes of the structure of interest without the need for a preliminary data set.

The present invention provides a method for producing an imaging plane of a structure of interest positioned in a MRI system. The image of the structure of interest is depicted on a display 104 of the operator console 100. The operator selects such image by using the input device 101 and interactively moving in real-time through planar sections of the structure of interest. The operator, using the input device 101, selects a first, second and third point in up to three different planar sections of the structure of interest. The points are depicted on the display 104 by icons selected by the operator from a library available in the MRI system, such as "+". With the selection of the three points, the CPU 108 of the computer system of the MRI system determines an imaging plane containing the three selected points. In addition to determining the planar section containing the three selected points, the method also determines the centroid of the imaging plane centered on a triangle defined by the three selected points. The image plane geometry is sent directly and rapidly to the MRI system to generate a new imaging plane of the structure of interest. In addition, imaging plane in-plane offsets are sent directly and rapidly to the MRI system to optimally position the new imaging plane of the structure of interest relative to the three selected points. The computer system of the MRI system calculates the angles and offsets based on the geometry of the three selected points on the structure of interests and sends such data to the system controller 122 which makes the necessary adjustments to the pulse sequence in the pulse generator 121. As described above, the waveforms produced by the pulse generator 121 are applied to the gradient amplifier system 127 and the new imaging plane of the structure of interest is produced by the MRI system and displayed on the operator console 100. The MRI system computer 108 also determines the in-plane orientation of the new imaging plane of the structure of interest and aligns such new imaging plane for display. The elapsed time from the selection of the third point on the structure of interest to the displaying of the new imaging plane of the structure of interest is approximately one second. It should be understood that the elapsed time may be less than one second but is constrained only by the system performance.

The present invention can be used by the operator to select a planar section that has an aspect selected from a group including an axial view, a sagittal view, a coronal view and an arbitrary oblique view. The view selected is typically determined by the particular structure of interest under study. The method can also be repeated a plurality of times to produce a corresponding plurality of imaging planes. Such method may be used during the study of blood flow in veins and arteries.

Figure 3:
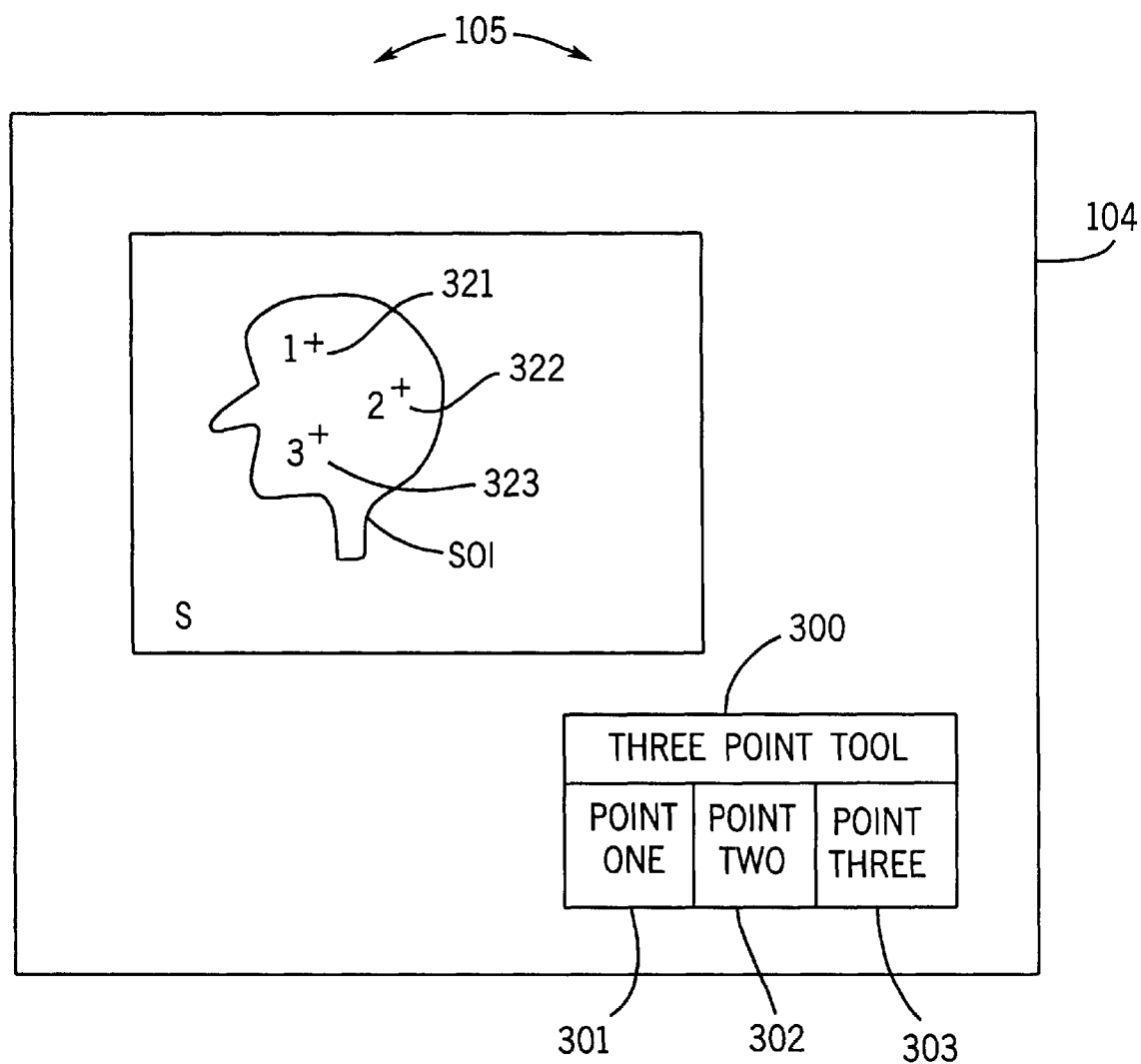
FIG. 3 is an illustration of the graphical user interface on the display screen of the operator console of the MRI system.

Referring to FIG. 3, the present invention includes a graphical user interface 105 for producing an imaging plane on an image of a structure of interest that is positioned in an MRI system. The MRI system typically includes an operator console 100 that has a display screen 104 and an input device 101. The graphical user interface 105 is displayed on the display screen 104 of the MRI system. The display includes the image of the structure of interest (SOI). The graphical user interface 105 also includes a three point tool 300 icon with three separate point selection icons designated point one 301, point two 302 and point three 303.

In operation, the operator of the MRI system, after interactively paging through real-time planar section of the SOI view displayed on the display screen 104, selects the three point tool 300 on the display screen 104 by using the input device 101. The input device 101 can be selected from a group including a mouse, a joystick, a keyboard, a touch ball, a touch screen, a voice control and a light wand. "Clicking" on the three point tool icon 300 instructs the MRI system computer 108 that three points will be selected. The operator then selects each of the point icons, 301, 302 and 303. By "clicking" on the point one icon 301, the operator is instructing the MRI system computer 108 that the first selected point will be designated. The operator, using the input device, then selects a point 321 on the image of the structure of interest. The graphical user interface marks the image with an icon and a digit. The operator uses the same procedure for the other two points 302 and 303 and designates the other two points on the image 322 and 323. It should be understood that the points selected on the image may be on different planar sections or regions of the structure of interest.

Thus, it should be apparent that there has been provided in accordance with the present invention a method and apparatus for using three points to defined a 2D MR imaging section on a structure of interest positioned in a MRI system that satisfies the objectives and advantages set forth above. Although the invention has been described in conjunction with specific embodiments thereof, it is evident that alternatives, modifications and variations will be apparent to those ordinarily skilled in the art. Accordingly, it is intended to embrace all such alternatives, modifications and variations that fall within the spirit and scope of the appended claims.

What is claimed is:

1. A method for producing an imaging plane of a structure of interest positioned in a MRI system, the steps comprising:

(a) interactively moving in real-time through planar sections of the structure of interest;

(b) selecting in real time a first point in a planar section of said structure;

(c) selecting in real time a second point in a planar section of the structure of interest;

(d) selecting in real time a third point in a planar section of the structure of interest;

(e) determining in real time a new imaging plane containing the three selected points;

(f) determining in real time the center of the new imaging plane by finding the centroid of a triangle defined by the three points;

(g) sending the imaging plane geometry directly and immediately to the MRI system to generate a new imaging plane of the structure of interest;

(h) sending the new imaging plane in-plane offsets directly and immediately to the MRI system to optimally position the new imaging plane on the structure of interest relative to the selected points;

(i) determining in real time the in-plane orientation of the new imaging plane and aligning such new imaging plane for display while the MRI system is scanning; and (j) displaying said new imaging plane.

2. The method as recited in claim 1, including a step of further maneuvering such new imaging plane on the structure of interest.

3. The method as recited in claim 1, in which the steps of (b) through (j), inclusive, are repeated a plurality of times to produce a corresponding plurality of imaging planes.

4. The method as recited in claim 1, wherein the planar section has an aspect selected from a group comprising an axial view, a sagittal view, a coronal view and an arbitrary oblique view.

5. The method as recited in claim 1, including a step of adjusting a pulse sequence in the MRI system wherein the imaging plane contains and is centered on the structure of interest.

6. The method as recited in claim 1, wherein the structure of interest is an anatomical structure.

7. The method as recited in claim 1, wherein the steps of (e) through (j), inclusive, occur in approximately one second or less once the three points are selected.

8. The method as recited in claim 1, wherein the steps of (b), (c) and (d) are performed by an input device selected from a group comprising a mouse, a joystick, a keyboard, a track ball, a voice control, a touch screen, and a light wand.

9. The method as recited in claim 1, including a step of displaying the three selected points on the new imaging plane.

10. The method as recited in claim 1, including a step of selecting at least one additional point in a planar section of the structure of interest and determining a new imaging volume containing at least the four selected points.

11. An apparatus for producing an imaging plane of a structure of interest positioned in a MRI system, the apparatus comprising:

(a) a means for interactively moving in real-time through planar sections of the structure of interest;

(b) a means for selecting in real time a first point in a planar section of said structure;

(c) a means for selecting in real time a second point in a planar section of the structure of interest;

(d) a means for selecting in real time a third point in a planar section of the structure of interest;

(e) a means for determining in real time a new imaging plans containing the three selected points;

(f) a means for determining in real time the center of the new imaging plane by finding the centroid of a triangle defined by the three points;

(g) sending the imaging plane geometry directly and immediately to the MRI system to generate a new imaging plane of the structure of interest;

(h) sending the new imaging plane in-plane offsets directly and immediately to the MRI system to optimally position the new imaging plane on the structure of interest relative to the selected points;

(i) a means for determining in real time the in-plane orientation of the new imaging plane and aligning such new imaging plane for display while the MRI system is scanning; and (j) a means for displaying said new imaging plane.

12. The apparatus as recited in claim 11, including a means for further maneuvering such new imaging plane on the structure of interest.

13. The apparatus as recited in claim 11, wherein the selected planar section has an aspect selected from a group including an axial view, a sagittal view, a coronal view and an arbitrary oblique view.

14. The apparatus as recited in claim 11, including a means for adjusting a pulse sequence in the MRI system wherein the imaging plane contains and is centered on the structure of interest.

15. The apparatus as recited in claim 11, wherein the structure of interest is an anatomical structure.

16. The apparatus as recited in claim 11, wherein the displaying of the new imaging plane occurs in approximately one second or less after the three points are selected.

17. The apparatus as recited in claim 11, wherein the means for selecting is performed by an input device selected from a group comprising a mouse, a joystick, a keyboard, a track ball, a touch screen, a voice control and a light wand.

18. The apparatus as recited in claim 11, including a means for selecting at least one additional point in a planar section of the structure of interest and determining a new imaging volume containing at least the four selected points.

19. A method for producing an imaging plane of a structure of interest positioned in a MRI system, the steps comprising:

(a) interactively paging through stored images of planar sections of the structure of interest;

(b) selecting a first point in a planar section of said structure;

(c) selecting a second point in a planar section of the structure of interest;

(d) selecting a third point in a planar section of the structure of interest;

(e) determining a new imaging plane containing the three selected points;

(f) determining the center of the new imaging plane by finding the centroid of a triangle defined by the three points;

(g) sending the imaging plane geometry directly and rapidly to the MRI system to generate a new imaging plane of the structure of interest;

(h) sending the new imaging plane in-plane offsets directly and rapidly to the MRI system to optimally position the new imaging plane on the structure of interest relative to the selected points;

(i) determining the in-plane orientation of the new imaging plane and aligning such new imaging plane for display;

(j) displaying said new imaging plane; and, (k) selecting in real time at least one additional point in a planar section of the structure of interest and determining in real time a new imaging volume containing at least the four selected points.

* * * * *